(12) United States Patent
Cheng et al.

(10) Patent No.: US 6,504,238 B2
(45) Date of Patent: Jan. 7, 2003

(54) LEADFRAME WITH ELEVATED SMALL MOUNT PADS

(75) Inventors: Johnny Cheng, Yung Ho (TW); Joyce Hsu, Yung Ho (TW); Joe Chiu, Pan Chiao (TW)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/766,194

(22) Filed: Jan. 18, 2001

(65) Prior Publication Data

US 2001/0048149 A1 Dec. 6, 2001

Related U.S. Application Data

(60) Provisional application No. 60/179,183, filed on Jan. 31, 2000.

(51) Int. Cl.$^7$ ............................................. H01L 23/495
(52) U.S. Cl. ..................... 257/676; 257/81; 257/99; 257/666; 257/672; 438/22; 438/24; 438/123; 438/124
(58) Field of Search .................................. 257/666–677, 257/81, 99; 438/22, 24, 123, 144

(56) References Cited

U.S. PATENT DOCUMENTS 5,214,307 A  * 5/1993 Davis ........................... 257/666
6,091,135 A  * 7/2000 Lee ............................... 257/649

* cited by examiner

*Primary Examiner*—David Nelms
*Assistant Examiner*—Long Tran
(74) *Attorney, Agent, or Firm*—Wade J. Brady, III; Frederick J. Telecky

(57) ABSTRACT

A semiconductor device comprising a lead frame that includes a large area mount pad having small elevated pads to which a semiconductor chip is attached. The small mount pads coupled with usage of a minimal amount of chip attach adhesive provide improved reliability against vapor phase package cracking, and further allow a given lead frame to be used by a family of chip sizes and shapes. The large pad provides good thermal dissipation, as well as stress relief during fabrication of the lead frame.

13 Claims, 4 Drawing Sheets

LEADFRAME WITH ELEVATED SMALL MOUNT PADS

This application claims the benefit of Provisional application Ser. No. 60/179,183, filed Jan, 31, 2000.

FIELD OF THE INVENTION

This invention relates generally to the semiconductor devices, and more particularly to lead frames used in the assembly of micro electronic devices.

BRIEF DESCRIPTION OF PRIOR ART

Integrated circuit devices, having an integrated circuit chip and a lead frame which are sealed within a protective enclosure find wide use in products, among which are consumer electronics, computers, automobiles, telecommunications and military applications. A means to electrically interconnect an integrated circuit chip to circuitry external to the device frequently takes the form of a lead frame. The lead frame is formed from a highly electrically and thermally conductive material, such as copper or copper alloys. The lead frame is stamped or etched into a plurality of leads, and a central area, called a chip mount pad, onto which the integrated circuit chip is attached. The chip is electrically connected to the leads, usually by wire bonding, and the device is encapsulated to provide mechanical and environmental protection.

Conventional lead frames, as illustrated in a plan view in FIG. 1, are assembled into a plastic encapsulated semiconductor package. The lead frame includes a planar chip mount pad 110 somewhat larger than the integrated circuit chip to be assembled, as indicated by dashed lines 120. The chip is to be affixed by an adhesive or an alloy to the mount pad 110, and is connected to the inner portions of the leads by bonding wires, prior to encasing in a plastic resin.

Lead frames are fabricated by stamping or etching relatively thin strips of metal to form a plurality of lead frames attached to a system of support rails 130 which provide a means for transporting through semiconductor packaging assembly equipment. In an as fabricated lead frame strips, the leads 112 are maintained in the plane of the support rails 130. The centrally located chip mount pad 110 is attached to the support rails by narrow tie straps 113. The chip mount pad 110 and the innermost portion of the tie straps 113 are downset or Z-axis offset from the plane of the support rails 130 in order to allow the surface of a chip 120 to be more nearly in the plane of the lead tips, thereby requiring shorter wire bonds 125 and allowing a more reliable bonding process.

Currently many lead frames are fabricated with a single or multiple small circular mount pads 202 as shown in FIG. 2, or simply have tie straps to which the chip is attached, and the large chip pad is eliminated. The small chip pads 202 are connected to outer support rails 205 by thin etched or stamped tie straps 206. Support rails 205 also hold together one or more lead frames in a strip until assembly of the package is completed.

Those lead frames having one or more small pads 202 as in FIG. 2 are typically referred to as S-pad or small pad lead frames. A small, circular pad is positioned approximately mid-way from the edge of the tie strap 206 to the center of the lead frame where the tie straps intersect 208. The chip, represented by dashed lines 203 is positioned atop the pads 202 and the unpatterned surface of the chip affixed to the pads by a chip attach adhesive (not shown). As with conventional lead frames, the tie straps and mount pads are offset from the plane of the support rails in order to provide a more planar structure with reduced bond wire lengths.

Lead frames having a reduced chip pad area were developed in response to a failure mechanism in surface mount plastic packages, often referred to as "pop corn effect" or vapor pressure package cracking, and which is illustrated in FIG. 3. With conventional lead frames, ambient moisture ingress into the plastic resin is trapped between the solid chip 310 with mount pad 320 and the resin 340. When subjected to a rapid thermal excursion, such as solder attachment to a printed wiring board, vapor pressure within the package causes areas of the weak adhesion in the adhesive 311 between the chip 320 and chip mount pad 310, and between the pad 310 and the resin 340 to delaminate. Arrows 350 represent areas where vapor pressure builds up, and which in turn result in delamination 351, and often in bulges and cracks 352 in the resin. This failure mechanism is associated with large semiconductor die and is most prominent with thin packages.

"S" pad or small chip contact pads in the lead frames solve the failure by eliminating large planar surfaces between the chip pad and resin. Further, they greatly reduce the amount of chip attach adhesive used and which has been found to be both a source of vapor pressure, as well as the material within the system having poor mechanical strength.

However, a severe limitation of S-pad lead frames is a loss of thermal dissipation found in conventional lead frames having thermally conductive chip mount pads equal to or greater in area than the chip itself. As illustrated in FIG. 4, heat transfer paths from a semiconductor device 420 are (1) into the metal chip pad 410, (2) from the pad through the resin 440 to the back of the package, (3) from the pad into the leads with direct transfer to an external printed circuit board 460, (4) from the surface of the chip through the resin 440 into the ambient, and (5) from the chip through the resin to the leads 412. In effect, large chip mount pads 410 are used as heat spreaders within the package by expanding the area of the heat dissipation, and by bringing the pad into close proximity to the leads.

A second issue with S-pad lead frames, not present with conventional chip mount pad lead frames is a tendency for warping and bowing of the narrow tie straps, and consequently non-planar mount pads which in turn result in yield and reliability losses.

In the lead frame manufacturing process, patterned lead frame strips are positioned in a die and the chip pads are formed downward or "z" axis offset using a tool which elongates that portion of metal under pressure, repositioning the integrated patterned tie straps and chip pad. Under pressure the ductile metal in two or more tie straps is forced downward to form angled bends and is pressed toward the center of the lead frame by using a forming punch to press the tie straps against the die surface. The ductile metal converges toward the center and often warps or bows in S-pad lead frames. With conventional leaf frames, the large die pad area allows the stress to be relieved in the pad itself, and consequently has little tendency to warp.

As smaller and thinner integrated circuit packages, having good reliability with respect to both moisture ingress and thermal dissipation are demanded by the industry, lead frames which support these issues are needed.

Clearly, it would be very desirable for the industry to have a lead frame with the mechanical stability and thermal transport advantages of conventional chip pads larger than the chip perimeter, but with the advantages of S-pads having small contact areas to the chip, and which use a very small amount of chip attach adhesive, known to contribute to vapor phase package cracking.

SUMMARY OF THE INVENTION

It is an object of this invention to provide a semiconductor device with a lead frame having a chip mount pad including small contact areas, as well as the thermal transport advantages of a large mount pads.

It is an objective to provide a device which provides improved package reliability during solder reflow processing.

It is an object of the invention to provide a semiconductor package which requires a minimal amount of chip attach adhesive, supporting both reduced cost and improved reliability of the product.

It is further an object of the invention to provide a lead frame which is compatible with multiple semiconductor chip sizes and shapes, thereby minimizing chip specific tooling inventory and manufacturing costs of customized chip mount pads.

It is an object of the invention to provide a lead frame chip pad which acts like a heat spreader within the semiconductor package.

It is further an object of the current invention to provide a method for manufacturing a lead frame having small pad contact area to the chip, and yet large pad thermal dissipation advantages.

It is further an object of the invention to provide a lead frame having small contact areas to the chip, but the mechanical stability of conventional large mount pads.

Yet another advantage of the current invention is to provide a lead frame having the advantages of high thermal conductivity, the manufacturing advantages of ductility, and the stress relief of a large area chip pad.

The present invention is a semiconductor device which comprises a lead frame that includes a large area mount pad having small elevated pads. A semiconductor chip is attached to the elevated pads using the minimum amount of chip attach adhesive which is known to contribute to vapor pressure package cracking. The large area pad allows good thermal spreading and dissipation of heat through the encapsulated package.

Owing to the reduced area for chip attachment, the lead frame is usable for a family of semiconductor chips of varying sizes and shapes; this in turn reduces the number of device specific lead frames to be tooled and to be held in inventory.

Alloys of copper are the heavily favored lead frame materials because of their excellent thermal conductivity, their ease of processing, and the malleability and ductility of these copper alloys allows greater latitude in forming lead frame variations. Moreover, the large area chip pad provides stress relief during the lead frame manufacturing process, which eliminates the warpage and distortion that frequently occurs with small pad lead frames.

DETAILED DESCRIPTION OF THE PREFERRED EMBODIMENTS

Figure 1:
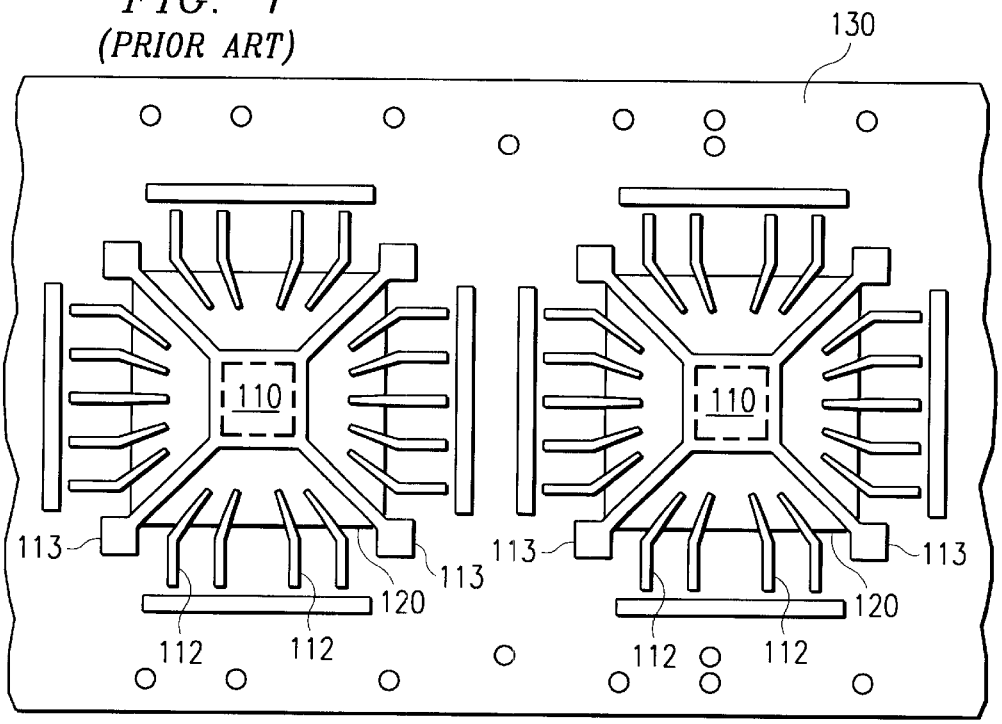
FIG. 1 is a plan view of conventional lead frame and support structure. (Prior Art)
Figure 2:
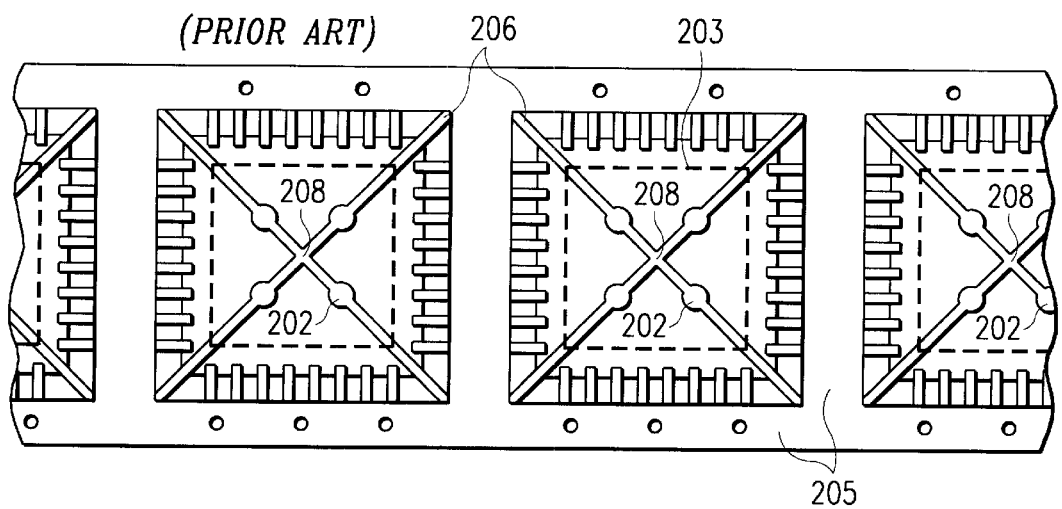
FIG. 2 is a "S" or small pad lead frame. (Prior Art)
Figure 3:
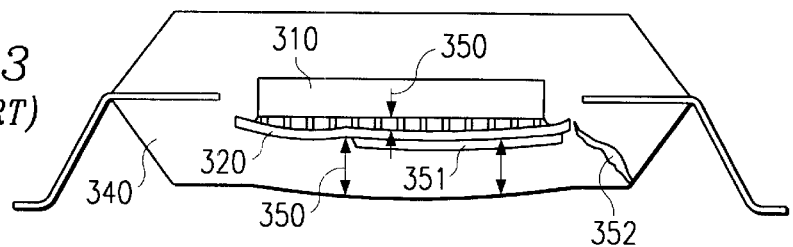
FIG. 3 illustrates a conventional lead frame in a plastic package having failed as a result of "pop corn effect". (Prior Art)
Figure 5:
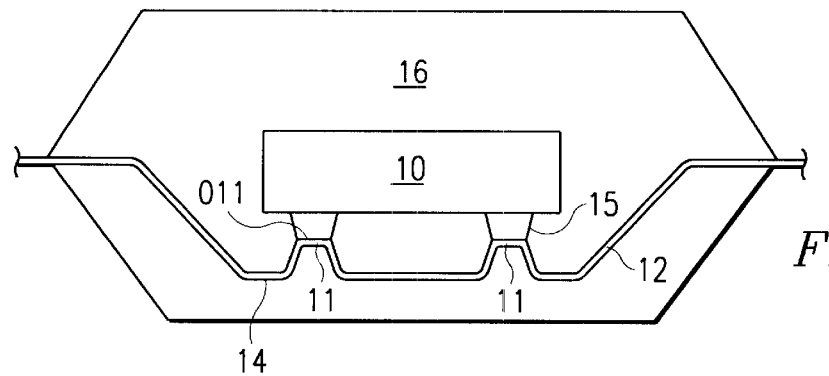
FIG. 5 is a cross section of a semiconductor package with elevated small pads integrated into a large mount pad.
Figure 6:
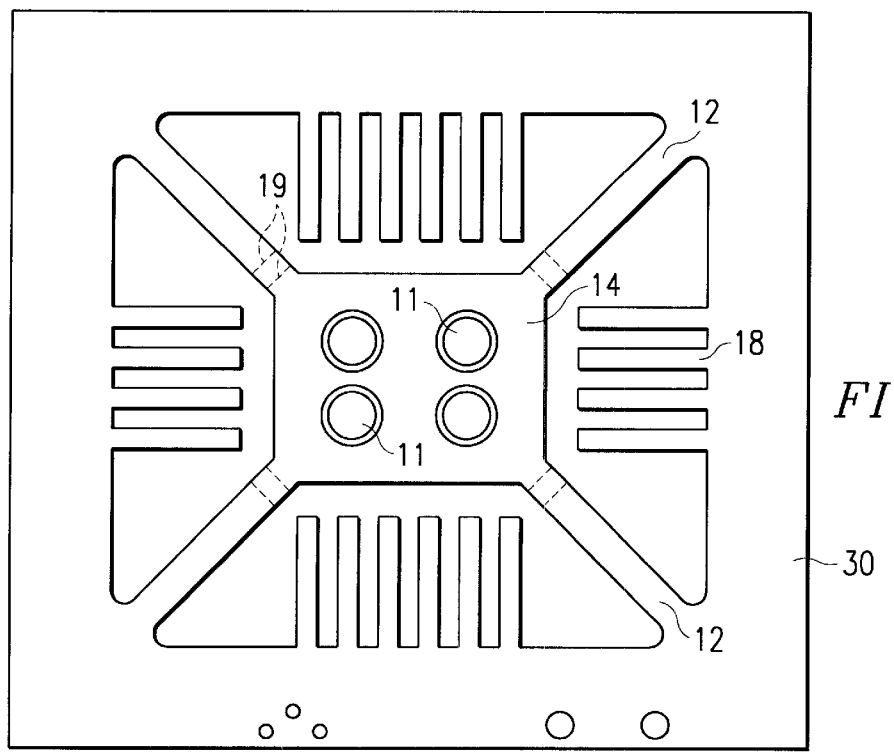
FIG. 6 is a lead frame of the current invention with multiple small elevated pads in the chip pad.
Figure 7:
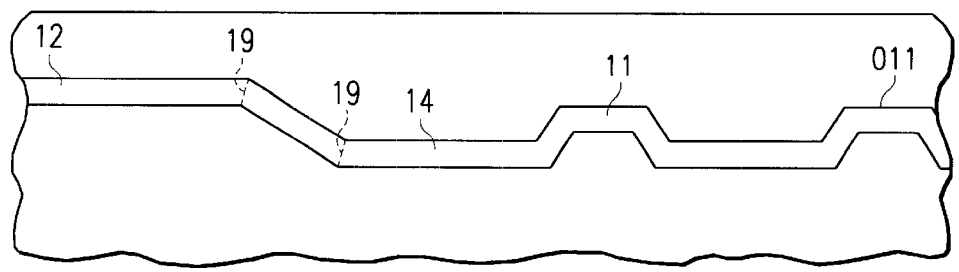
FIG. 7 is a cross section of a lead frame mount pad with elevated small pads.

FIGS. 5 through 7 illustrate an embodiment of the present invention. A semiconductor device includes a lead frame mount pad 14 having impressions formed upwards from the plane of the pad resulting in one or more small pad(s) 11 onto which a semiconductor chip 10 is affixed by a chip mount adhesive 15. Effectively the small pads 11 perform the same function as the known S-pad lead frame, in FIG. 2 with respect to providing only small contact areas between the chip and the lead frame, and by requiring only a minimal amount of chip attach adhesive. The lack of a large contact area between chip and metal pad eliminates the "pop corn effect", wherein the pad delaminates from the encapsulating resin and may cause bowing and cracking of the plastic when the device is subjected to rapid thermal excursions. An example of the failure is given in FIG. 3.

The small volume of chip mount adhesive required with small pads minimizes outgassing from the adhesive, and the resultant vapor pressure build-up within the plastic package. There are additional advantages of lower unit cost due to the small amount of costly chip mount adhesive used, and precision in the adhesive placement is insignificant because any adhesive overflow will remain on the sides of the small pads, and will not interfere with wire bonding or with resin adhesion.

Figure 4:
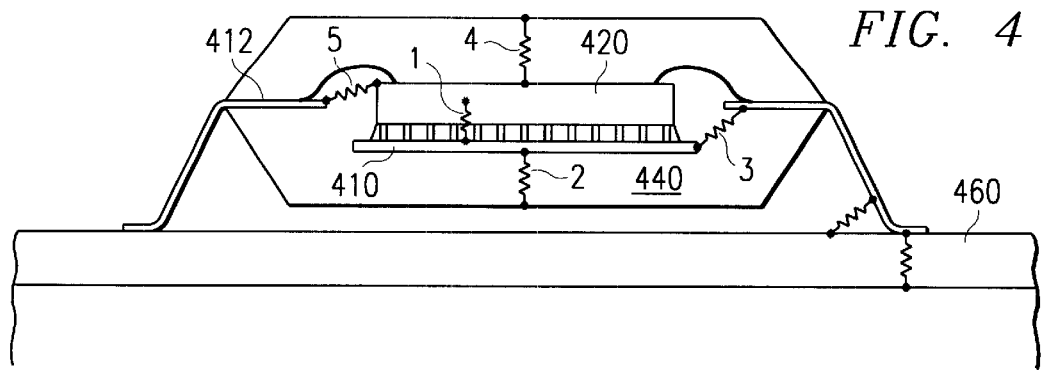
FIG. 4 illustrates major heat flow paths from an encapsulated integrated circuit device.

A significant advantage of small pads connected to and forming an integral portion of a full sized conventional mount pad is its enhanced thermal dissipation capability. High thermal conductivity lead frame material, such as an alloy of copper provides a direct thermal transport mechanism between the chip and the large area metal chip pad, thereby allowing heat to be dissipated from the back of the package, as well as through lead fingers, as illustrated in FIG. 4 at locations (1) and (2).

In FIG. 5, it can be seen that in an assembled package the semiconductor chip 10 is affixed to planar first surface 011 of the elevated pads 11 by an adhesive 15. The downset mount pad is attached to tie straps 12 which are downset near the pad. The chip 10 is wire bonded to lead fingers (not shown), and the assemblage is encapsulated in a plastic resin 16.

FIG. 6 is a plan view of an as fabricated lead frame having small elevated pads 11 integrated within a large mount pad 14, and that the large pad is supported by tie straps 12 which are integrally formed with the external support rails 30 at the corners. Near the perimeter of the mount pad 14, tie straps 12 and the mount pad 14 are offset from the plane of the lead fingers 18 and support rails 30 by formed angles at approximately the locations identified by the dashed lines 19. The array of small elevated pads within the chip pad are formed upward from the plane of the pad such that the first surface 011 of the elevated pads is at approximately half the tie strap downset distance. The pad 14 offset depth is in the range of 0.1 to 0.2 mm and the small elevated pads are in the range of 0.04 to 0.08 mm above the first surface of the pad 14. The diameter of the first surface 011 of small pads 11 is in the range of 0.5 to 3 mm.

A cross section of a portion of the lead frame in FIG. 7 provides a more detailed view of the offset angles. A tie strap 12 is offset at angles 19 to form the plane of the large die mount pad 14. Small elevated pads 11 are offset in the opposite direction, or upwards to approximately half the distance of the large pad downset.

In relatively thin, ductile lead frame materials angles are formed by elongating the metal using a forming punch. The technique for forming small elevated pads within a large pad is similar to that used to offset chip mount pads and tie straps as found in a preponderance of commercially available lead frames.

Figure 8:
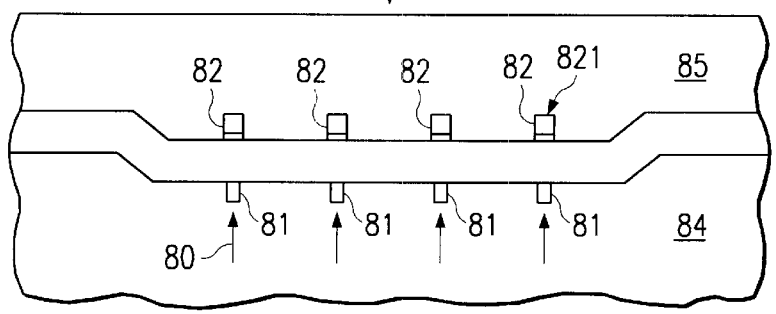
FIG. 8 illustrates a die press with tools for forming elevated small pads.

A preferred embodiment of the present invention uses conventional hydraulic or electrically driven presses for forming offsetting angles in lead frames, in combination with a novel offset tooling set. The form die press is in general the same type as that that used to form a mount pad offset, but as illustrated in FIG. 8, it further includes a series of circular forming tools located is the area where chip mount pad of the lead frame is positioned. A patterned and formed lead frame having a full sized mount pad (not shown) is positioned in a die press and the press is clamped as indicated by the arrow 850. An array of circular punch tools 81 of steel are recessed into the base of the die press 84. Cavities 82 are positioned in the upper die surface 85 at locations which correspond to the punches 81 in the lower die press. As indicated by arrows 80, the punches 81 are projected under pressure against the lower surface of the ductile chip mount pad (not shown). The cavities 82 allow the ductile lead frame material to be formed upward resulting in a series of small elevated chip pads within the larger pad. A flat, planar surface 821 is provided at the base of each cavity in order to insure a flat, planar surface formed on the small pads. Forming tools are retracted to a home position in the die press and the lead frame removed from the press. Dimensions of the tool set is a function of the specific lead frame dimensions, but each punch tool 81 is in the range of 0.25 to 2 mm in diameter and the cavities 82 are the diameter of the corresponding punch tool plus the lead frame thickness.

Applications for elevated small pads lead frames are somewhat similar to those known for S-pad frames, but a significant advantage of the elevated small pads lies in the fact that during elongation of metal by forming under pressure, the metal is pushed toward the center from all sides, and with small pads on thin tie straps, warpage and distortion often occurs. However, in the elevated small pads of the current invention stresses from metal movement are absorbed by the large area of copper, and warping of the large pad is not an issue.

Figure 9A:
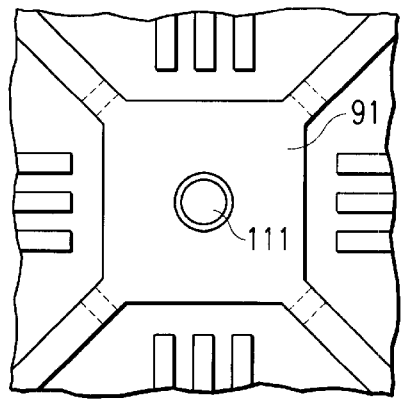
FIGS. 9a, 9b and 9c demonstrate alternate embodiments of elevated small pad lead frames.
Figure 9B:
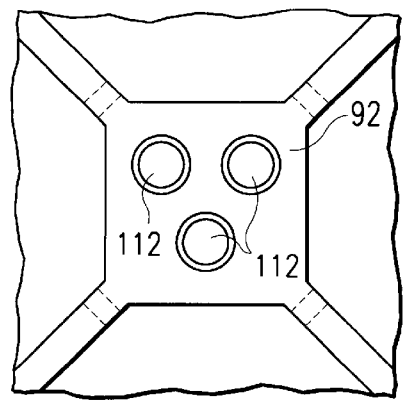
Figure 9C:
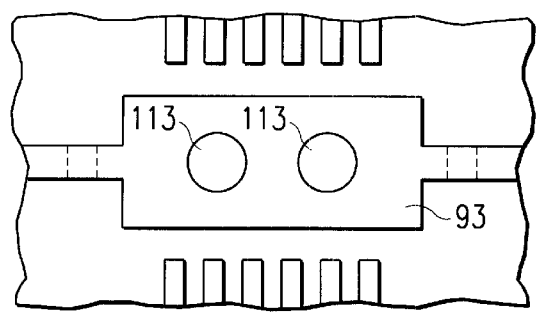

The elevated small pad lead frame embodiment in FIG. 6 is four small pads 11 in a square large pad 14. However, it should be understood that the invention is applicable not only to square pads, but to rectangular or multisided pads, and that there may be a single pad 111, within a large mount pad 91 as shown in FIG. 9a, three elevated pads 112 positioned in a triangle on a large pad 92 as shown in FIG. 9b, or two or more pads 113 placed in a line on a rectangular pad 93 as shown in FIG. 9c.

The invention may be embodied in various forms, and is applicable to a variety of plastic package types, such as Quad Flat Packs (QFP), Small Outline Packages (SOP), or any other surface mount plastic package type where the advantages of good thermal dissipation and avoidance of vapor pressure cracking are desirable characteristics. Small elevated pad lead frames are further applicable to packages having exposed heat spreaders formed by the chip mount pad.

A significant advantage provided by elevated small pad lead frames lies in the application of a single lead frame to a multiple chip sizes and shapes. Within a standardized lead pitch and for a specified number of leads on a lead frame or package family, the elevated small pad lead frame accommodates a large range of chip sizes. For example, a 132 pin quad flat pack lead frame may be used for many chip sizes and types, and therefore, this invention is applicable to a large number of integrated circuit devices, thereby eliminating the need for specific tooling and for inventory for each specific chip.

Figure 10A:
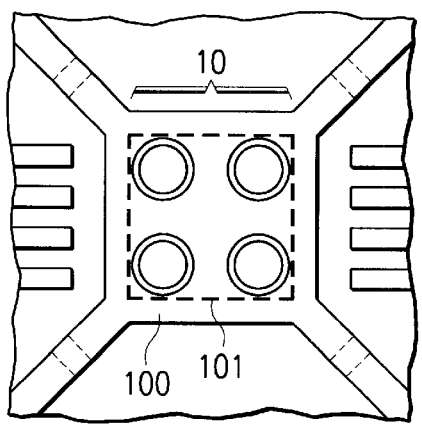
FIGS. 10a, 10b, and 10c illustrate varying chip sizes on the same lead frame of the current invention.
Figure 10B:
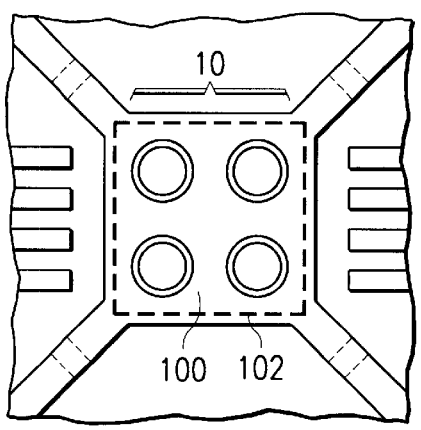
Figure 10C:
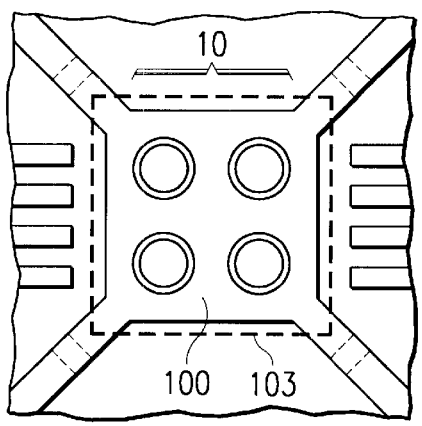
Figure 11:
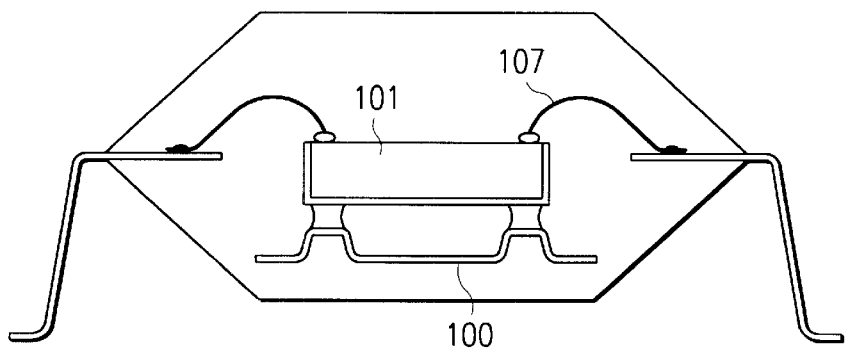
FIG. 11 is a cross section of a wire bonded assemblage of the current invention.

With conventional lead frames, a single lead frame tooling is required for each chip size and shape in a lead frame or package family, or small variation thereof. Typically chip size is only slightly smaller than the mount pad size, in an attempt to avoid bond wires from shorting to the pad. However, as illustrated in FIGS. 10a, 10b, and 10c, one elevated small pad lead frame design 10 is used for assembly of a variety chip sizes and shapes. In FIG. 10a the chip 101 is less than 50% of the large pad 100 area, but because the large pad 100 is positioned below the plane of the chip and internal lead frame bonding fingers, shorting of the bond wires 107 to the metal pad is not an issue, as demonstrated in FIG. 11. Further, the large pad with small chips in a given package family provides improved thermal dissipation and heat spreading.

In FIG. 10b, the chip 102 is only slightly smaller than the pad, as is typical of conventional chip pad to chip ratios. In FIG. 10c, the chip 103 is greater than the pad size, but is confined within the internal lead finger tips. Because the chip is affixed to the first surface of the small pads, there is no concern for adhesive contamination of the lead frame bond fingers, as would be the case with conventional pads if the chip were larger than the chip mount pad.

A variety of chip sizes and shapes are applicable to a given elevated small pad lead frame as long as the chip perimeter is equal to or larger than the outermost edge of the elevated mount pad and the chip perimeter is within the interior lead fingers.

Detailed descriptions of the preferred embodiment are provided herein. It is to be understood, however, that the present invention may be embodied in various forms. Therefore, specific details disclosed herein are not to be interpreted as limiting, but rather as a basis for teaching one skilled in the art to employ the present invention in virtually any appropriate detailed system, structure or manner.

What is claimed is:

1. A semiconductor device comprising:
   a) a lead frame having an array of small mount pads elevated from the surface of a relatively large mount pad,
   b) a semiconductor circuit chip selectively affixed to the surface of the small pads with a minimal amount of adhesive, sufficient to cover said small pads only;
   c) bonding wires interconnecting the chip bond pads to the lead frame, and
   d) a molded resin encapsulation of the assemblage.

2. A semiconductor device as in claim 1 wherein said small mount pads are formed from, and are an integral part of the large pad.

3. A semiconductor device as in claim 1 wherein said large pad is downset from the plane of the internal lead frame leads, and the surfaces of the small pads are positioned about one-half of said downset distance above the large pad.

4. A semiconductor device as in claim 1 wherein the lead frame comprises a copper alloy.

5. A device as in claim 1 wherein said small pads form a direct heat path between the chip and the large pad.

6. A semiconductor device as in claim 1 wherein the elevated pads are arrayed in a square pattern.

7. A semiconductor device as in claim 1 wherein the elevated pads are arrayed in a triangular pattern.

8. A semiconductor device as in claim 1 wherein the elevated pads are arrayed in a linear pattern.

9. A semiconductor device as in claim 1 having a single centrally located small elevated pad.

10. A semiconductor device as in claim 1 wherein said chip area is equal to or greater than the outermost perimeter of the elevated pads, and is within the lead frame fingers.

11. A semiconductor device as in claim 1 wherein the assemblage comprises a Small Outline Package.

12. A semiconductor device as in claim 1 wherein assemblage comprises a Quad Flat Pack.

13. A semiconductor device as in claim 1 wherein the assemblage comprises a surface mounted package.

* * * * *